May 4, 1971 R. L. ROHR 3,577,278

ARTICLE SURFACE TREATING APPARATUS AND METHOD

Filed Dec. 23, 1968

INVENTOR
ROBERT L. ROHR
BY Hansel L. McGee
ATTORNEY

United States Patent Office 3,577,278

Patented May 4, 1971

3,577,278

ARTICLE SURFACE TREATING APPARATUS AND METHOD

Robert L. Rohr, Scarsdale, N.Y., assignor to International Business Machines Corporation, Armonk, N.Y.

Filed Dec. 23, 1968, Ser. No. 786,067
Int. Cl. B08b 3/02
U.S. Cl. 134—1 12 Claims

ABSTRACT OF THE DISCLOSURE

An article surface treating apparatus is described herein in which an article holder having a plurality of articles mounted thereon is buoyantly disposed in a tank containing a fluid. The article holder is continuously caused to rotate by a stream of a liquid solution impinging thereon, so as to cause the successive surface treatment of the articles. The articles may be subjected to a process, e.g. (cleaning and rinsing or etching and rinsing) wherein several solutions may be programmed to serially treat the surfaces of the plurality of articles.

BACKGROUND OF THE INVENTION

Field of the invention

The present invention relates to an improved apparatus for surface treating of articles; more specifically the invention relates to an apparatus for surface treating semiconductor wafers and to a method of surface treating said articles.

Description of the prior art

In the preparation of semiconductor wafers, such as germanium, silicon, GaAs, etc., a polishing step is required. During the polishing step the wafer is affixed to a polishing wheel by means of a wax, or wax-like substance. This wax material and the polishing compound must be removed from the wafer prior to any subsequent use thereof. Thus, a cleaning step is necessary to prepare the wafer for further use.

In the past the wafers have been cleaned by placing them in a holder or basket of some kind and immersing them in a vat containing a suitable solvent for removing foreign substances, i.e. wax material and polishing compound. The holder is removed from the vat into another solvent containing vat to remove the previous solvent. Finally, the wafers are immersed in water to remove traces of the previously used solvents. During the above manual steps, i.e. transferring the wafers from one solvent vat to another, the wafers are exposed to air which causes the solvents to evaporate, leaving a solvent stain or residue on the wafer. This stain or residue causes a great deal of difficulty in the further processing of the wafer. For example, it has been found that when the wafer is to be used in an epitaxial growth operation, epitaxial growth cannot be obtained. The underlying reason for this failure has been found to be the presence of the solvent stain. A great deal of effort is required to remove the stain and in many cases the stain cannot be removed. Thus, the wafers must be rejected.

It has been suggested that ultrasonic cleaning be used as a remedy for the above problem. However, while ultrasonic cleaning is of value as a means for dislodging the foreign matter from the wafer initially and thereby increases its solubilizations, the inherent problems are not allayed. That is, the wafers must still be placed into and removed from vats and are thus exposed to air and its drying effect. Further, there is no continuous removal of the solvent which becomes contaminated. As a result a residue of the foreign matter will always reside on the wafer.

Cascading of solvents has also been suggested as a means for overcoming the above problem. In this method of cleaning, different solvents are sequentially and continuously allowed to flow onto and off the wafer without having to manually remove the wafer from one vat to another. While this method is an improvement over the ultrasonic cleaning technique alone, it requires large and expensive equipment to make it practicable. It also requires the need for frequent cleaning of the large vats that are required. This is necessary since solvent residues are deposited on the walls of the vats and can be deposited on the wafer during a cleaning operation.

Thus, it is desirable to provide an apparatus in which semiconductor wafers may be cleaned without the above attendant shortcomings of the suggested remedies. That is, it is desirable to provide an apparatus which permits ultrasonic cleaning while the wafer is continuously rinsed with fresh solutions. It is also desirable to have an apparatus which permits a cleaning operation through many solution changes without manual assistance, that is, unattended by an operator.

SUMMARY OF THE INVENTION

The inventor has provided an apparatus which permits ultrasonic and turbulent cleaning of semiconductor wafers while also permitting the continuous rinsing thereof with fresh solutions. The apparatus, through the use of a sequence of timed valves, pressurized soltuion dispensers and vacuum operated waste solution collectors, permits the cleaning operation to proceed through many solution changes unattended, thereby preventing the air drying of the wafers during solution changes. Additionally, the apparatus reduces the number and size of the solution vats which are necessary. Another advantage of the present apparatus, is the absence of any electrical means which may spark and cause the ignition of volatile solvents.

These and other advantages are achieved through a cleaning apparatus which incorporates ultrasonic cleaning as well as turbulent overflow rinsing. The apparatus comprises a hollow article holding means having a depending, centrally disposed cylindrical sump portion, an ultrasonic tank, solution dispensers and a waste collecting means. The article holding means is adapted to float on the surface of a fluid which is confined in the ultrasonic tank. The solution dispensers are provided with finely tipped nozzles which direct a stream of solution into a plurality of article holding dishes which are mounted in a circular space relation within the hollow article holding means. The stream of solution emanating from the nozzle causes the floating article holding means to rotate slowly and supply fresh solution to each dish as the article holding means rotate. The stream produced a scrubbing action, turbulence and immediate overflow rinse in each dish. Each of the dishes is provided with a convex bottom and an overflow slot in the side thereof. The convex bottom permits the articles in the article holding dish to lift as the solution flows into the dish and the overflow slot produces a controlled overflow pattern, keeping the liquid level of the cleaning solution low. A piece of rigid tubing extends downwardly into the sump of the article holding means and permits free rotation of the article holding means thereabout. The other end of the tube is connected to a waste liquid collector and functions to move the waste cleaning solution from the sump.

OBJECTS OF THE INVENTION

A cardinal object of the invention is to provide an improved article surface treatment apparatus which overcomes the attendant shortcomings of the prior art.

Another object of the invention is to provide an apparatus for cleaning semiconductor wafers which eliminates the need for exposing the wafers to air during the cleaning operation.

Still another object of the invention is to provide a cleaning apparatus for cleaning semiconductor wafers which obviates the need for manually transferring the wafers from solution to solution during a cleaning operation.

An yet another object of the invention is to provide an apparatus which incorporates ultrasonic and turbulent cleaning in one operation.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figures 1, 2:
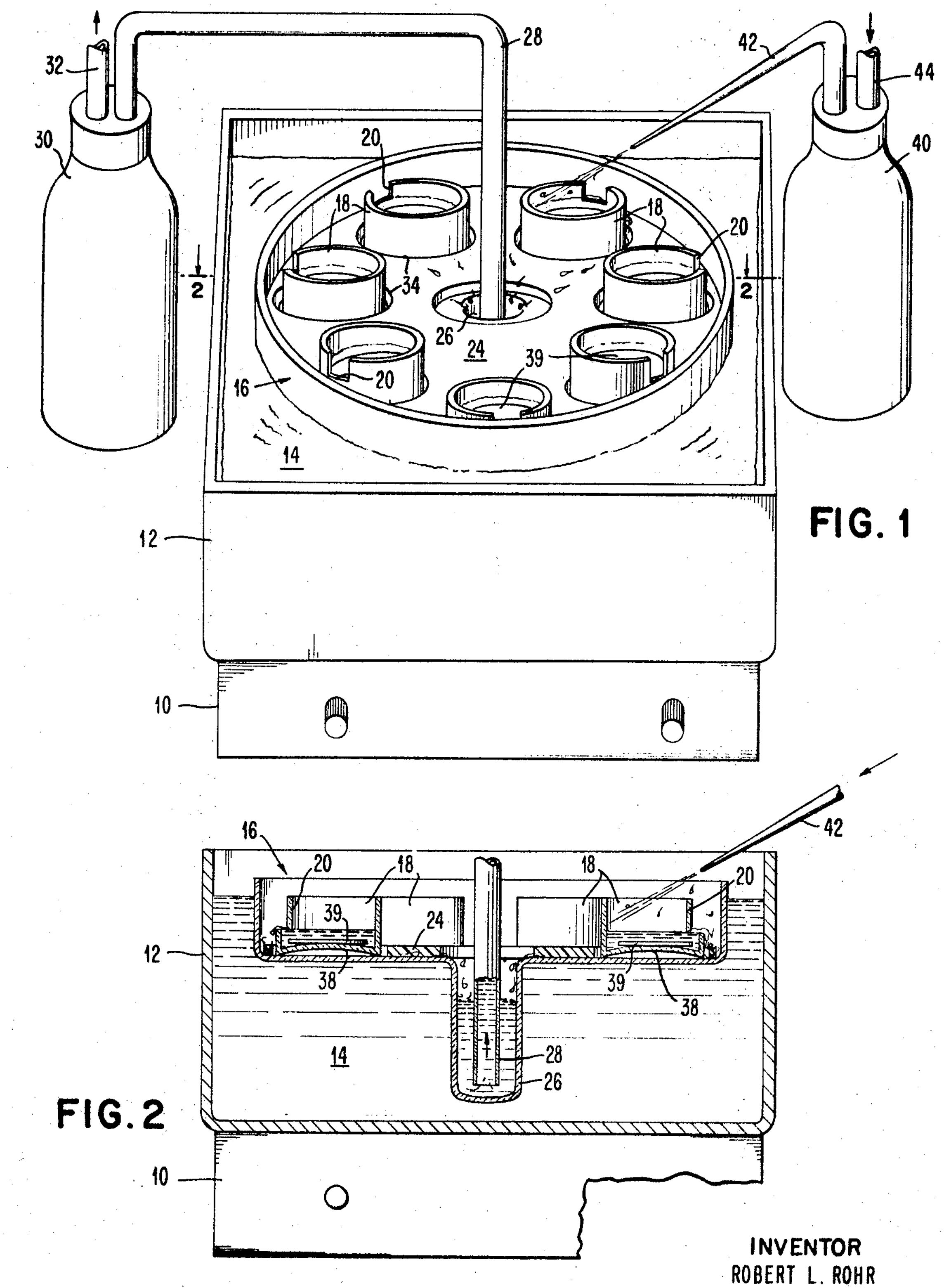
FIG. 1 is a schematic perspective view showing an ultrasonic generator in operative relation to a fluid containing cleaning tank and having the present invention mounted in operative relation thereto.
FIG. 2 is a cross-sectional view of FIG. 1 depicting an article holding means and its centrally disposed sump portion together with wafer holding containers mounted therein.

Referring in detail to the drawings, wherein like numerals designate like parts throughout the several views and first to FIG. 1 thereof, a conventional ultrasonic generator 10 is shown having mounted thereon a rectangular ultrasonic tank 12 containing a fluid 14 which is in operative relation with said ultrasonic generator 10. Disposed in said fluid 14 is an article holding means (pan 16) having disposed about its circumference a plurality of article holding dishes 18. In this instance the articles residing in said dishes are semiconductor wafers 39. Each dish 18 is provided with an overflow slot 20.

The article holding means pan (16) is circular in cross-section and has a side wall attached to a flat base portion 24. Centrally disposed in the pan 16 is a cylindrical sump portion 26. Pan 16 is constructed for any suitable material such as glass, a solvent, and/or acid and base resistant plastic or a non-corrosive metal. For purposes of this invention, pan 16 is constructed from glass. Leading into the centrally disposed sump 26 is tubular member 28 which extends and is connected to a waste liquid container 30. The tubular member 28 serves to remove waste, e.g. solvents or acids, from the sump 26 and also acts as a bearing about which pan 16 rotates. The waste container 30 is constructed from a solvent, and/or acid and base resistant material. In addition to tubular member 28 there is attached to waste container 30 an outlet tube 32. Tube 32 is conducted to a source (not shown) for applying a partial vacuum through tube 28 to pan 16.

The dishes 18 are circular in cross section and are circularly spaced within the pan 16. They are seated in circular inserts 34 which are fashioned in pan 16. The dishes 18 are fabricated from any suitable material, e.g. glass, solvent and/or acid and base resistant plastics or a non-corrosive metal. For the purposes of this invention they are made of glass. Article holding dish 18 is fashioned with an overflow groove or slot 20. The overflow slot 20 of dishes 18 produces a controlled overflow pattern, and keeps the liquid level within said dishes 18 low for better dilution and prevents wafers 39 from turning over therein. Also, the dishes 18 have a slightly convex bottom 38, see FIG. 2, which permits the solution to flow under wafers 39 to cause said wafers 39 to lift, thereby preventing an entrapment of liquids thereunder. The solution is injected into dishes 18 from a solution container 40 through a finely tipped nozzle 42 attached to said container 40. Also attached to container 40 is a tubular member 44. Tubular member 44 is attached to a source (not shown) for applying a positive pressure within container 40 to thereby cause the solution to flow out of container 40 through nozzle 42. The container 40, with nozzle 42, and tubular member 44 may be fashioned from any suitable material, i.e. glass, solvent and/or acid and base resistant plastic or a non-corrosive metal. The container used in this invention is fashioned from a plastic material such as polyethylene.

In operation, the pan 16 having mounted thereon a plurality of dishes 18 is floated on liquid 14 contained in tank 12. The tubular member 28 is inserted into sump 26 of the pan 16. A negative pressure is applied to the sump 26 via the waste container 30 and through tubular member 32 from a negative pressure producing source (not shown). The negative pressure allows the pan 16 to float and to rotate on liquid 14 about the lower end of tubular member 28. The ultrasonic generator 10 is then turned on to produce ultrasonic vibrations within the fluid 14. A solution is then injected into the dishes 18 as each dish 18 rotates past the nozzle 42. As indicated above, the solution is caused to exit at nozzle 42 as a positive pressure is applied to container 40 through tubular member 44 from a positive pressure producing source (not shown). The solution that is being projected upon the wafer 39 may be either a cleaning solution or an etching solution depending upon the stage of the process of wafer preparation. For the purposes of this invention, the solution is considered to be a cleaning solution. The stream of solution being directed at the dishes 18, causes the floating pan 16 to rotate slowly and supply fresh cleaning solution to each dish 18 as pan 16 rotates and positions each of said dishes 18 in the direct path of the solution stream. The speed at which pan 16 rotates is dependent upon the direction of the stream of solution and the pressure at which it is dispersed. Each time the stream of cleaner solution strikes the surface of wafer 39, it produces a scrubbing action, turbulence and an immediate overflow rinse thereof. The dishes 18 because of their slightly convex bottom 38 permit the solution to flow under the wafers 39 and cause them to be lifted, thereby preventing entrapment of foreign material thereunder. As the solution builds up within the dishes 18 it overflows therefrom at overflow slots 20 to produce a controlled overflow pattern keeping the liquid level of the cleaner solution low within said dishes 18. The waste cleaning solution flowing from dishes 18 flows into sump 26 where it is continuously removed through tubular member 28. The waste solution is caused to flow through tubular member 28 into container 30 by means of the negative pressure being applied thereto through tube 32 from the negative producing source (not shown), as indicated above. Because of the ultrasonic vibration and the turbulent and scrubbing action of the solution as it emanates from the nozzle 42, the wafers 39 are thoroughly cleaned.

If in addition to subjecting the wafers 39 to a cleaning solution, it is necessary to rinse the wafers 39 after they have been cleaned, several containers (not shown) akin to container 40 and containing rinsing solutions may be serially disposed about the tank 12. So positioned, rinsing solutions can be dispensed from the containers in serial fashion. For example, the containers containing the rinse solution may be connected to a series of positive pressure producing sources or means which are programmed to pressurize the solution dispensers in a timed fashion. As an example, in the cleaning of a germanium wafer after polishing, the wafer is cleaned with trichlorethylene.

For example, the cleaning solution is projected at the wafers 39 for a preselected time which is sufficient to clean the wafers 39 after which time a second container is programmed to be pressurized and to thereby dispense and project a stream of a rinsing solution such as acetone, onto the surfaces of the wafers 39. Finally, after a predetermined time of the acetone rinse a third container is programmed to be pressurized to thereby dispense and project water onto the surface of the wafers 39 for a preselected time. At the completion of the rinsing steps the negative pressure source is removed. The pane 16 and its plurality of wafer containing dishes 18 are then removed from tank 14 and stored for a subsequent operation. It is to be noted that the wafer containing dishes 18 contain a sufficient level of the last rinsing fluid to cover the wafer 39 and thereby prevent its exposure to air. It should similarly be realized that throughout the cleaning and rinsing operation, the wafer 39 is never exposed to air, thus, hard to remove solution stains are never permitted to form thereon.

While the drawings depict the use of only one solution dispensing container it should be realized by those skilled in the art that a plurality of such containers may be used in a sequential manner as above described. Although the invention has been particularly shown and described with reference to a preferred embodiment thereof, it will be understood by those skilled in the art that various changes in form and details may be made therein without departing from the spirit and scope of the invention.

I claim:

1. An apparatus for treating surfaces of articles comprising in combination:

(a) a container having a liquid located therein;

(b) article holding means for holding a plurality of articles thereon and floating on said liquid; and (c) solution dispensing means for providing a liquid to said article holding means for causing rotation of said article holding means thereby permitting successive surface treatment of said articles disposed on said article holding means.

2. An apparatus according to claim 1 wherein there is attached to the central portion of said article holding means, waste collecting means for removing an overflow solution therefrom and to maintain said article holding means in buoyant relation with said liquid in said tank.

3. An apparatus according to claim 2 wherein said liquid dispensing means comprises a solution container having attached thereto a nozzle and a tubular member, said tubular member being connected at its other end to a positive pressure generating means for providing a pressure in said solution container to force said liquid from said container through said nozzle onto said article holding means.

4. An apparatus according to claim 3 wherein said waste collecting means comprises a cylindrical sump centrally disposed in said article holding means, a first tubular means extending from said centrally disposed sump and being attached to a waste liquid container; said liquid container also having attached thereto a second tubular means, said second tubular means being attached at its other end to negative pressure producing means to permit a partial negative pressure to be established within said waste liquid container to thereby cause waste liquid to flow from said sump through said first tubular means and into said liquid container.

5. An apparatus according to claim 4 wherein said article holding means is provided with a plurality of circular inserts for supporting said articles.

6. An apparatus according to claim 5 wherein said article holding means includes article holding dishes disposed in said circular inserts to support said articles.

7. An apparatus according to claim 6 wherein said article holding dishes are provided with overflow slots to permit the overflow of liquid therefrom and having a convex bottom to permit said liquid to flow under said articles and to cause said articles to lift.

8. An apparatus in accordance to claim 7 wherein there is attached to said liquid holding tank, ultrasonic generating means in vibrative relation to said liquid in said tank.

9. A method for surface treating articles comprising the steps of:

(a) floating an article holding means having a plurality of articles disposed thereabout in a liquid containing tank;

(b) dispensing a liquid onto said article holding means to cause the same to rotate and to thereby permit successive surface treatment of said plurality of articles with said liquid.

10. A method according to claim 9 including the step of continuously removing waste liquid from said article holding means.

11. A method according to claim 9 including the step of applying ultrasonic vibrations to said liquid on the surfaces of said article.

12. A method according to claim 9 wherein said articles are semiconductor wafers.

References Cited

UNITED STATES PATENTS

| | | | |
|---|---|---|---|
| 1,665,423 | 4/1928 | Skelton | 134—138 |
| 2,074,100 | 3/1937 | Bonish | 134—138X |
| 2,333,707 | 11/1943 | Curtis | 134—138 |
| 2,567,820 | 9/1951 | Messerschmidt | 134—138 |
| 2,985,003 | 5/1961 | Gelfand et al. | 134—184X |
| 3,140,647 | 7/1964 | Miller | 134—138X |
| 3,489,608 | 1/1970 | Jacobs et al. | 134—33X |

FOREIGN PATENTS

| | | | |
|---|---|---|---|
| 516,710 | 1/1931 | Germany | 134—139 |

JOSEPH SCOVRONEK, Primary Examiner

D. G. MILLMAN, Assistant Examiner

U.S. Cl. X.R.

134—25, 32, 138